United States Patent
Bhat et al.

(10) Patent No.: US 12,355,399 B2
(45) Date of Patent: Jul. 8, 2025

(54) INDUCTIVE-CAPACITIVE VOLTAGE-CONTROLLED OSCILLATOR WITH INCREASED COMMON-MODE IMPEDANCE

(71) Applicant: Cisco Technology, Inc., San Jose, CA (US)

(72) Inventors: Abhishek Bhat, Allentown, PA (US); Joseph V. Pampanin, Hellertown, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 18/456,373

(22) Filed: Aug. 25, 2023

(65) Prior Publication Data
US 2025/0070715 A1    Feb. 27, 2025

(51) Int. Cl.
H03B 5/12    (2006.01)
H03L 7/099   (2006.01)

(52) U.S. Cl.
CPC ......... *H03B 5/1253* (2013.01); *H03B 5/1212* (2013.01); *H03B 5/1215* (2013.01); *H03B 5/1228* (2013.01); *H03B 5/1243* (2013.01); *H03L 7/099* (2013.01); *H03B 2200/0062* (2013.01)

(58) Field of Classification Search
CPC .......... H03B 5/1253; H03B 2200/0062; H03B 5/1215; H03B 5/1228; H03B 5/1243; H03B 5/1212; H03L 7/099
USPC ............................... 331/167, 117 FE, 108 C
See application file for complete search history.

(56) References Cited

U.S. PATENT DOCUMENTS

| | | | |
|---|---|---|---|
| 8,629,732 B2 * | 1/2014 | Trivedi | H03B 5/1212 331/177 V |
| 8,710,937 B1 | 4/2014 | Sutardja | |
| 11,218,113 B1 | 1/2022 | Bhat et al. | |
| 11,575,359 B2 | 2/2023 | Bhat et al. | |
| 2011/0102093 A1 * | 5/2011 | El Rai | H03B 5/1218 331/117 FE |
| 2015/0031313 A1 | 1/2015 | Murphy et al. | |

(Continued)

FOREIGN PATENT DOCUMENTS

| | | |
|---|---|---|
| CN | 114584075 B | 6/2023 |
| WO | 2019218371 A1 | 11/2019 |

OTHER PUBLICATIONS

E. Hegazi, H. Sjoland and A. A. Abidi, "A filtering technique to lower LC oscillator phase noise," IEEE Journal of Solid-State Circuits, vol. 36, No. 12, pp. 1921-1930, Dec. 2001.

(Continued)

*Primary Examiner* — Arnold M Kinkead
(74) *Attorney, Agent, or Firm* — Patterson + Sheridan, LLP (57) ABSTRACT

A voltage-controlled oscillator (VCO) is disclosed that includes an inductor-capacitor (LC) tank coupled with a first voltage supply node, a pair of cross-coupled transistors that are coupled with the LC tank and coupled with each other at a tail node, and a high-frequency current return path to the first voltage supply node. The high-frequency return path includes a first decoupling capacitor coupled with the first voltage supply node and a second voltage supply node, and a first inductor coupled with the tail node and the second voltage supply node. The first inductor is formed as a first conductive trace and has a quality factor (Q) value of 25 or greater.

20 Claims, 6 Drawing Sheets

(56) References Cited

U.S. PATENT DOCUMENTS

2018/0076765 A1 3/2018 Taghivand et al.
2020/0235700 A1 7/2020 Valdes-Garcia et al.

OTHER PUBLICATIONS

D. Murphy, H. Darabi and H. Wu, "A Vco with implicit common-mode resonance," 2015 IEEE International Solid-State Circuits Conference, San Francisco, CA, 2015, pp. 1-3. [Abstract Only].
A. Bhat, R. Nandwana and K. Lakshmikumar, "An Interference Suppression Technique for Millimeter-Wave LC VCOs Using a Multiport Coupled Inductor," IEEE Transactions on Circuits and Systems II: Express Briefs, vol. 69, No. 3, pp. 919-923, Mar. 2022. [Abtract Only].
Amir Masnadi et al., "A Compact Dual-Core 26.1-To-29.9GHZ Coupled-CMOS LC-VCO with Implicit Common-Mode Resonance and FOM of-191DBC/HZ at 10MHZ," IEEE, Dated: Apr. 23, 2020 [Abstract Only].
Partial European Search Report for European Application No. 24194255.6, dated Feb. 11, 2025, 14 Pages.
European Search Report for European Application No. 24194255.6, dated May 6, 2025, 12 Pages.

\* cited by examiner

INDUCTIVE-CAPACITIVE VOLTAGE-CONTROLLED OSCILLATOR WITH INCREASED COMMON-MODE IMPEDANCE

TECHNICAL FIELD

Embodiments presented in this disclosure generally relate to electronic communications. More specifically, embodiments disclosed herein relate to a voltage-controlled oscillator (VCO) suitable for wireline and wireless communication systems.

BACKGROUND

Increasing data rate requirements, in both wireline and wireless communication systems, pose design challenges for clocking circuits. To increase overall system throughput, wireless and wireline communication systems can include multiple clock generators that support multiple communication lanes. In some cases, the multiple clock generators are implemented in a single chip. Design of these clock generators focuses on reducing power consumption and/or space requirements, while still maintaining accuracy.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Embodiments include a voltage-controlled oscillator (VCO) comprising an inductor-capacitor (LC) tank coupled with a first voltage supply node, a pair of cross-coupled transistors that are coupled with the LC tank and coupled with each other at a tail node, and a high-frequency current return path to the first voltage supply node. The high-frequency return path comprises a first decoupling capacitor coupled with the first voltage supply node and a second voltage supply node, and a first inductor coupled with the tail node and the second voltage supply node. The first inductor is formed as a first conductive trace and has a quality factor (Q) value of 25 or greater.

Embodiments also include an electronic circuit comprising a differential LC VCO and at least one decoupling capacitor extending between a voltage supply node and a ground node. The decoupling capacitor comprises a metal-oxide-metal capacitor. The electronic circuit further comprises at least one conductive trace extending between a tail node of the differential LC VCO and the ground node. The conductive trace is disposed in a first metal layer in the five topmost metal layers of a metal layer stack of the electronic circuit.

Embodiments also include an electronic circuit comprising a LC VCO comprising a pair of cross-coupled transistors connected with each other at a tail node, at least one decoupling capacitor extending between a voltage supply node and a ground node, at least a first conductive trace disposed in a first metal layer and extending between the tail node and the ground node, and at least a second conductive trace, disposed in a second layer below the first metal layer, and extending between bulk terminals of the pair of cross-coupled transistors and the ground node or a power node.

EXAMPLE EMBODIMENTS

In wireline systems, multi-lane, single-chip solutions can be used to increase overall data throughput. Multiple clock generators can be used in a single chip to accommodate these multi-lane solutions. Very low jitter clocks are used to reduce error, due to small timing margins. Further, the area and/or power consumption of each clock generator are minimized to reduce overall area and/or power usage. Similarly, in wireless systems, multiple clock generators are used in multiple input-multiple output (MIMO) systems. The area and/or power consumption of each clock generator are similarly minimized. Further, integrated phase error is kept low to reduce the error vector magnitude, and phase noise is minimized to improve adjacent channel suppression. Millimeter-wave (mm-wave) voltage-controlled oscillators (VCOs) are used to support modern wireless systems (e.g., 5G, 6G, and beyond), and the implementation of the mm-wave VCOs can be challenging due to parasitics and substrate losses.

Phase-locked loops (PLL) are commonly used to generate accurate clocks in both wireline and wireless systems. The power consumption of PLLs can be minimized to improve the efficiency of the chip. As VCOs account for a significant portion of the power consumption of PLLs, it is desirable for a VCO to provide a low phase noise clock with minimal power consumption. However, techniques for reducing phase noise generally tend to consume more power. Inductor-capacitor (LC) VCOs can be used to minimize phase noise, but conventional LC VCOs tend to occupy greater area due to the spatial requirements of the inductor(s) and capacitor(s). Reducing phase noise and jitter for LC VCOs with low power consumption and/or area, is a significant challenge, especially for multi-lane transceiver integrated circuits (ICs).

An improved VCO architecture can be used to solve at least some of these issues. A compact layout structure includes routing that introduces additional inductance(s) in the common-mode return path of an LC VCO. The low substrate loss of the routing provides a high-Q, high-self-resonant frequency (SRF) common-mode inductance, which increases the common-mode impedance at even-harmonic frequencies of the VCO. In one embodiment, the common-mode return path also includes high-Q metal capacitor(s) that provide low impedance at the even-harmonic frequencies, which supports a well-defined path for high-frequency currents between voltage supply nodes (e.g., between VDD and ground).

In some implementations of the VCO architecture, bulk and/or n-well connections to the transistors of the VCO are made to the voltage supply nodes through connections separate from the high-Q routing. The source terminals of the cross-coupled transistors of the VCO may be connected together at a tail node of the VCO. Additional parasitic capacitances at the tail node may be mitigated by using the separate connections.

Beneficially, the increased common-mode impedance results in a lower phase noise of the LC VCO without any power overhead. Further, the layout structure of the LC VCO is compact, resulting in a reduced area of the LC VCO for a given phase noise level. The benefits are especially pronounced in a multi-lane transceiver having multiple LC VCOs implemented in a single chip.

Figure 1:
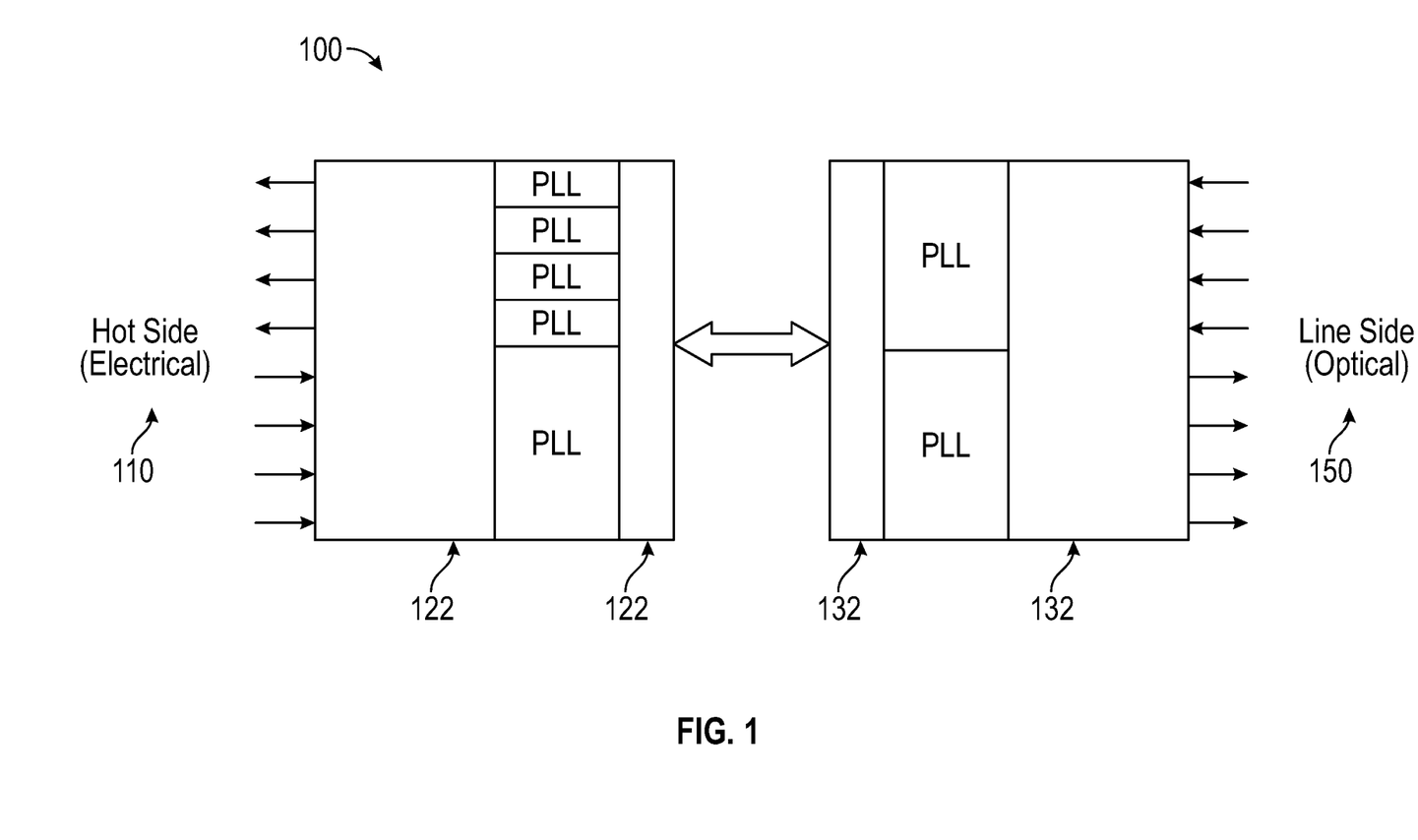
FIG. 1 illustrates clocking complexity in an example multi-lane transceiver, according to one or more embodiments.

FIG. 1 illustrates clocking complexity in an example multi-lane transceiver 100, according to an embodiment. Modern transceivers often include a large number of lanes, and a large number of PLLs. In some embodiments, each PLL of the multi-lane transceiver includes a VCO. This means that the VCO should be compact, while still limiting jitter and noise.

For example, the transceiver 100 (e.g., an opto-electronic multi-gigabit transceiver) transmits data between a host side 110 in the electrical domain and a line side 150 in the optical domain. The host side 110 of the transceiver 100 includes various components 122 (e.g., ports, filters, clock data recovery components, serializers, modulation components, etc.). The host side 110 further includes multiple PLLs (e.g., five as illustrated), each of which includes a VCO. The line side 150 of the transceiver 100 includes various components 132 (e.g., modulators, amplifiers, serializers, clock data recovery components, etc.) and additional PLLs (e.g., two as illustrated), each of which includes a VCO. Thus, the example transceiver 100 includes seven PLLs and seven VCOs. In an embodiment, this multiple PLL-based architecture aids PPM (parts per million) frequency error transfer between the host side 110 and the line side 150, to provide independent frequency control. It is desirable for the VCOs to be compact and power efficient while limiting jitter and noise. In an embodiment, a VCO can be used in a PLL or in any other suitable application (e.g., a function generator, a frequency synthesizer, etc.).

Figure 2:
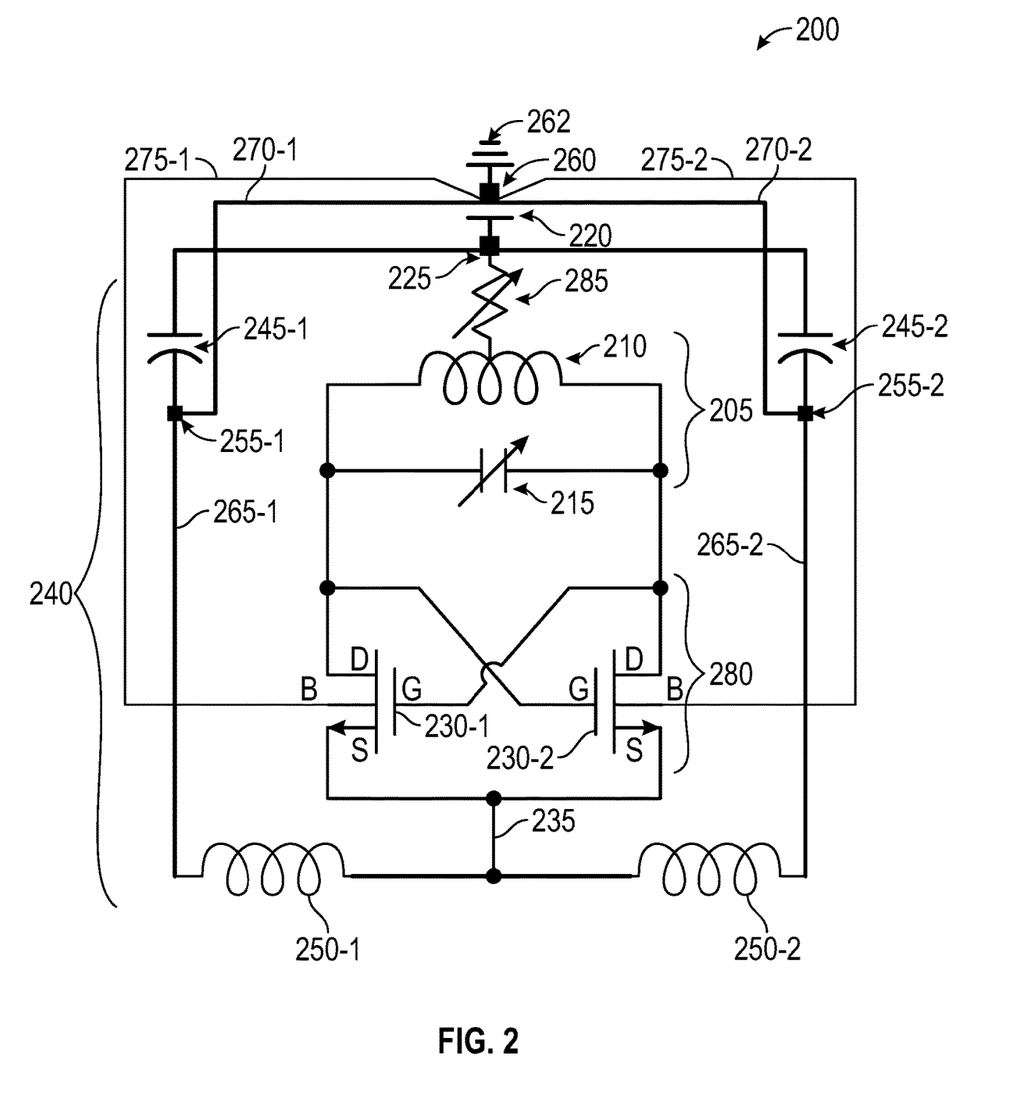
FIG. 2 is a schematic illustrating an improved architecture of an inductor-capacitor (LC) voltage-controlled oscillator (VCO) having a high-frequency return path, according to one or more embodiments.

FIG. 2 is a schematic illustrating an improved architecture of an inductor-capacitor (LC) voltage-controlled oscillator (VCO) 200 having a high-frequency current return path 240, according to one or more embodiments. The features of the LC VCO 200 illustrated in FIG. 2 may be used in conjunction with other embodiments. For example, multiple instances of the LC VCO 200 may be implemented in the transceiver 100 of FIG. 1.

The LC VCO 200 comprises an LC tank 205 having an inductor 210 and a capacitor 215 disposed in parallel. The inductor 210 and the capacitor 215 may have any suitable implementation. For example, the inductor 210 may be a single-turn or a multiple-turn inductor formed in one or more metal layers of the metal layer stack of the LC VCO 200. The capacitor 215 may also be formed in one or more metal layers of the metal layer stack. The capacitor 215 is shown as a variable capacitor, and may include multiple connected capacitor units (e.g., disposed in parallel), one or more variable capacitors (e.g., varactors), and combinations thereof. In some embodiments, the one or more variable capacitors are tuned such that the LC tank 205 resonates at a fundamental frequency $f_0$ for differential signals.

The LC tank 205 is coupled with a first voltage supply node 225. As shown, the first voltage supply node 225 is connected to a positive voltage supply 220 (e.g., VDD). In some embodiments, the LC tank 205 is connected to the first voltage supply node 225 through bias circuitry, which may include passive and/or active electronic components. As shown, the bias circuitry comprises a variable resistor 285 disposed between the first voltage supply node 225 and a tap of the inductor 210. The variable resistor 285 may be adjusted to maintain the voltage level (supplied by the positive voltage supply 220) to the LC tank 205 and/or other components of the LC VCO 200. Other non-limiting examples of the bias circuitry include a constant resistor, a PMOS current source, or a voltage regulator.

The LC VCO 200 further comprises a pair of cross-coupled transistors 280 that are coupled with the LC tank 205 and coupled with each other at a tail node 235 of the LC VCO 200. As shown, the pair of cross-coupled transistors 280 comprises n-type metal oxide semiconductor field effect transistors (which may be referred to as "n-type MOSFETs" or "nFETs") 230-1, 230-2. "Cross-coupled" indicates that the drain (D) terminal of each nFET 230-1, 230-2 is coupled with the gate (G) terminal of the other nFET 230-2, 230-1. The source(S) terminals of the nFETs 230-1, 230-2 are coupled with each other at the tail node 235 (also referred to as a "common-source node"). Although the pair of cross-coupled transistors 280 are depicted as including the nFETs 230-1, 230-2, alternate embodiments of the pair of cross-coupled transistors 280 may include p-type MOSFETs or combinations of n-type and p-type MOSFETs (e.g., a complementary MOS implementation).

The LC VCO 200 further comprises a high-frequency current return path 240 to the first voltage supply node 225. The high-frequency current return path 240 comprises a first decoupling capacitor 245-1 coupled with the first voltage supply node 225 and a second voltage supply node 255-1, and a first conductive trace 265-1 coupled with the tail node 235 and the second voltage supply node 255-1. The second voltage supply node 255-1 is connected, through a second conductive trace 270-1, to a negative voltage supply 262 (e.g., VSS or ground) at a third voltage supply node 260.

The first conductive trace 265-1 operates as an inductor 250-1 between the tail node 235 and the first decoupling capacitor 245-1. The first conductive trace 265-1 may be formed in any suitable metal layer(s) of the metal layer stack of the LC VCO 200 having a low resistivity and a low parasitic capacitance to the substrate. In some embodiments, the inductor 250-1 has a quality factor (Q) value of 25 or greater at an even-harmonic frequency that corresponds to a fundamental frequency of the LC VCO 200 that is suitable for transceiver applications of 200 GB per lane or greater. In one non-limiting example, the fundamental frequency ($f_0$) of the LC VCO 200 may be between about 25 GHz and 30 GHz, such as 28 GHZ, and the corresponding even-harmonic frequency may be about 56 GHz. The Q value for the inductor 250-1 is generally calculated according to the following:

$$Q_L = \frac{X_L}{R} = \frac{2\pi f \times L}{R}$$

where $X_L$, R, and L represent the reactance, resistance, and inductance of the inductor 250-1, respectively, and f represents the even-harmonic frequency.

In some embodiments, to achieve the low resistivity and low parasitic capacitance, the first conductive trace 265-1 is disposed in one of the topmost metal layers of the metal layer stack. The "topmost metal layers" in a given process are furthest away from the substrate, and traces formed in the topmost metal layers are dimensioned to be larger than those formed in the lower metal layers (e.g., a greater thickness, a greater minimum trace width, and/or a greater minimum spacing between traces), so that the traces in the topmost metal layers provide a lower resistance and a greater quality factor (Q). In some embodiments, the first conductive trace 265-1 is disposed in a metal layer in the five (5) topmost metal layers of the metal layer stack. In one specific example, the first conductive trace 265-1 may be formed in the topmost metal layer (i.e., the single metal layer that is furthest from the substrate). Other numbers of topmost metal layers are also contemplated, such as two (2), three (3), four (4), six (6), and greater. In some embodiments, the second conductive trace 270-1 is also disposed in one of the topmost metal layers of the metal layer stack of the LC VCO 200.

In some embodiments, the high-frequency current return path 240 further comprises a second decoupling capacitor 245-2 coupled with the first voltage supply node 225 and a second voltage supply node 255-2, and a third conductive trace 265-2 coupled with the tail node 235 and the second voltage supply node 255-2. The second voltage supply node 255-2 is connected to the negative voltage supply 262 at the third voltage supply node 260 through a fourth conductive trace 270-2.

The third conductive trace 265-2 operates as an inductor 250-2 between the tail node 235 and the second decoupling capacitor 245-2. The third conductive trace 265-2 may be formed in any suitable metal layer(s) of the metal layer stack of the LC VCO 200 having a low resistivity and a low parasitic capacitance to the substrate. In some embodiments, the inductor 250-2 has a quality factor (Q) value of 25 or greater at an even-harmonic frequency that corresponds to a fundamental frequency of the LC VCO 200 that is suitable for transceiver applications of 200 GB per lane or greater. The conductive traces 265-1, 265-2 may be disposed in a same metal layer as each other, or in different metal layers. In some embodiments, the third conductive trace 265-2 is disposed in one of the topmost metal layers of the metal layer stack of the LC VCO 200. In some embodiments, the decoupling capacitors 245-1, 245-2 comprise metal-oxide-metal (MOM) capacitors, which in some cases may be disposed in a plurality of the topmost metal layers. Beneficially, the MOM capacitors disposed in the top metal layers have a high quality factor (Q) and partly define a low-impedance path for high-frequency currents (e.g., even-harmonic frequencies) between the voltage supply nodes 255-1, 255-2 and the first voltage supply node 225.

The metal layer stack of the LC VCO 200 includes a plurality of metal layers that may be interconnected using conductive vias. The plurality of metal layers include one or more top metal layers that are disposed nearest to a top surface of the metal layer stack. In contrast, the terminals for the active electronic components of the LC VCO 200 (e.g., the nFETs 230-1, 230-2) are typically formed in lower metal layers such as M0, M1, M2. Similarly, routing for the power supplies (e.g., VDD, VSS/ground) is typically formed in a power mesh and/or ground mesh in lower metal layers such as M2, M3.

Traces formed in the top metal layers are dimensioned to be larger than those formed in the lower metal layers (e.g., a greater thickness, a greater minimum trace width, and/or a greater minimum spacing between traces), so that the traces of the top metal layers have a lower resistance and a greater quality factor (Q). In some cases, the dimensioning of traces at the various metal layers may be specified by the particular foundry used to manufacture the metal layer stack. In one example implementation, the conductive traces 265-1, 265-2 providing the inductors 250-1, 250-2 of the high-frequency current return path 240 are formed in metal layer(s) between an M17 metal layer and a bond pad ("AP") metal layer, the decoupling capacitors 245-1, 245-2 are formed in metal layer(s) between an M5 metal layer and an M11 metal layer, and the conductive traces 270-1, 270-2 connecting the voltage supply nodes 255-1, 255-2 to the third voltage supply node 260 are formed in metal layer(s) between an M12 metal layer and an M13 metal layer.

Figure 3:
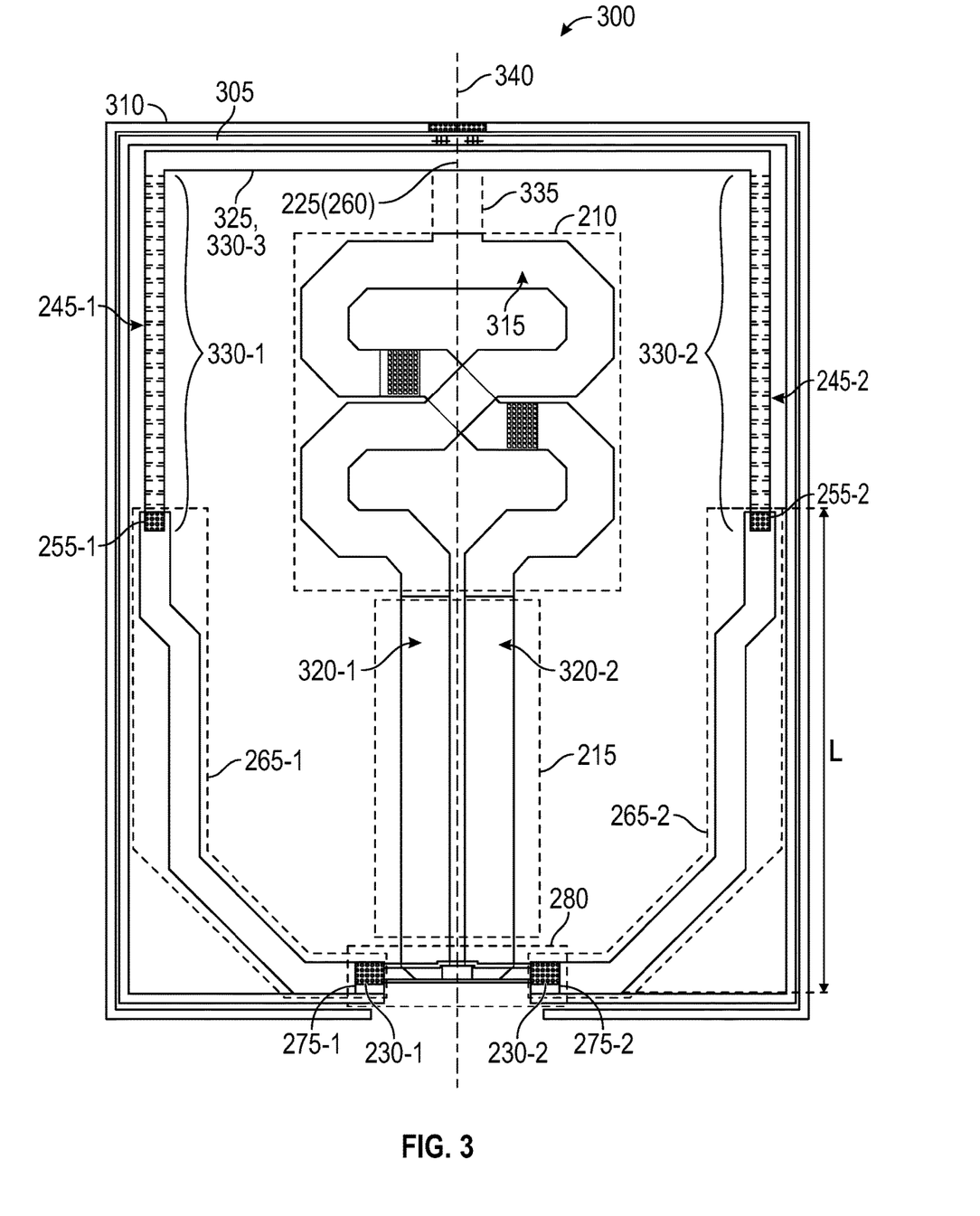
FIG. 3 is a diagram illustrating a top-view layout of an LC VCO having a high-frequency return path, according to one or more embodiments.

In some embodiments, the LC VCO 200 further comprises one or both of: a third conductive trace coupled with the first voltage supply node 225, and a fourth conductive trace coupled with the third voltage supply node 260. The third conductive trace and the fourth conductive trace are disposed in one or more metal layers other than a top metal layer of the metal layer stack. For example, the third conductive trace may be implemented as a power mesh in one of the lower metal layers such as M2 or M3, and the fourth conductive trace may be implemented as a ground mesh in one of the lower metal layers such as M2 or M3. An example arrangement of the third conductive trace and the fourth conductive trace is illustrated in FIG. 3 and discussed below. The third conductive trace and the fourth conductive trace form other connection(s) with the LC tank 205 and the pair of cross-coupled transistors 280. In some embodiments, the other connections comprise connections of bulk (B) terminals of the pair of cross-coupled transistors 280 (i.e., the nFETs 230-1, 230-2) to the negative voltage supply 262. Stated another way, the fourth conductive trace comprises conductive traces 275-1, 275-2 connecting bulk terminals of the respective nFETs 230-1, 230-2 to the third voltage supply node 260. Other types of connections are also contemplated, such as n-well connections of the nFETs 230-1, 230-2, and other biasing connections for components of the LC tank 205 and/or the pair of cross-coupled transistors 280.

By using the third conductive trace and/or the fourth conductive trace to connect to the voltage supplies, which are separate from the first conductive trace 265-1 and the second conductive trace 265-2 providing the inductors 250-1, 250-2, parasitic capacitances from the tail node 235 to ground are minimized.

FIG. 3 is a diagram 300 illustrating a top-view layout of an LC VCO having a high-frequency return path, according to one or more embodiments. The features of the diagram 300 may be used in conjunction with other embodiments, for example, representing an exemplary layout of the LC VCO 200 of FIG. 2.

The components of the LC tank 205 (e.g., the inductor 210 and the capacitor 215) are centrally disposed. The inductor 210 is shown as a single-turn inductor 315 having a figure-eight shape, but other configurations of inductors are also contemplated (e.g., a multi-turn inductor). Bias circuitry 335 of the LC VCO connects a conductive trace 325 (e.g., connected with the first voltage supply node 225) to a tap of the inductor 210. Some examples of the bias circuitry 335 are the variable resistor 285, a constant resistor, a PMOS current source, and a voltage regulator.

The tap of the inductor 210 is arranged at one end of the inductor 210, relative to a longitudinal axis 340 of the LC tank 205. The capacitor 215 includes conductive traces 320-1, 320-2 arranged at an opposing end of the inductor 210 and extending along the longitudinal axis 340. As shown, both of the conductive traces 320-1, 320-2 are spaced apart from each other and are offset from the longitudinal axis 340. In some embodiments, the capacitor 215 is formed between the conductive traces 320-1, 320-2. The capacitor 215 may be implemented as a MOM capacitor bank or varactors.

In some embodiments, the first decoupling capacitor 245-1 and the first conductive trace 265-1 are disposed on a first side of the LC tank 205, and the second decoupling capacitor 245-2 and the second conductive trace 265-2 are disposed on an opposing second side of the LC tank 205. Stated another way, the first decoupling capacitor 245-1 and the first conductive trace 265-1 form one high-frequency return path that is disposed on a first side of the LC tank 205, and the second decoupling capacitor 245-2 and the second conductive trace 265-2 form another high-frequency return path that is disposed on an opposing second side of the LC tank 205. As shown, the bias circuitry 335 connects to a first section 330-3 of the conductive trace 325 that extends perpendicular to the longitudinal axis 340. Sections 330-1, 330-2 of the conductive trace 325 extend, perpendicular to the first section 330-3 and parallel to the longitudinal axis 340, from opposing ends of the first section 330-3. In this way, the conductive trace 325 has substantially a U-shape. In some embodiments, a second conductive trace (not shown) disposed in another metal layer is partly or fully overlapped by the conductive trace 325. For example, the second conductive trace may have substantially the same U-shape as the conductive trace 325. The second conductive trace may represent the conductive traces 270-1, 270-2 of FIG. 2. In some embodiments, the conductive trace 325 is connected to VDD and the second conductive trace is connected to ground, e.g., centrally at the axis 340.

The sections 330-1, 330-2 of the conductive trace 325 operate as top plates of the respective decoupling capacitors 245-1, 245-2. In some embodiments, each of the decoupling capacitors 245-1, 245-2 comprises a plurality of MOM capacitance units that are arranged in parallel with each other. The decoupling capacitors 245-1, 245-2 also comprise respective conductive traces (not shown), disposed in other, lower layer(s) of the metal layer stack, that operate as bottom plates of the decoupling capacitors 245-1, 245-2. The sections 330-1, 330-2 operating as top plates are connected with the first voltage supply node 225 (e.g., VDD), and the conductive traces operating as bottom plates are connected to the third voltage supply node 260 (e.g., VSS or ground) through respective ones of the second voltage supply nodes 255-1, 255-2.

The nFETs 230-1, 230-2 are disposed at an end of the capacitor 215 opposing the end that is connected to the inductor 210. The source terminals of the nFETs 230-1, 230-2 are connected to respective ones of the first conductive trace 265-1 and the second conductive trace 265-2. At end sections that are connected to the nFETs 230-1, 230-2, the first conductive trace 265-1 and the second conductive trace 265-2 extend perpendicularly away from the longitudinal axis 340. At end sections that are opposing the other end sections connected to the nFETs 230-1, 230-2 (that is, the end sections connected to the second voltage supply nodes 255-1, 255-2), the first conductive trace 265-1 and the second conductive trace 265-2 extend parallel to the longitudinal axis 340. In some embodiments, the first conductive trace 265-1 and the second conductive trace 265-2 may further include one or more transition sections that extend parallel to, or perpendicular to, the longitudinal axis 340, and/or one or more that extend at other angles relative to the longitudinal axis 340. The dimensioning of the end sections and the one or more transition sections may be selected to present a desired inductance of the inductors 250-1, 250-2. In some embodiments, the overall length L of the first conductive trace 265-1 and the second conductive trace 265-2 along the dimension of the longitudinal axis 340 is between about 50 microns and 150 microns, such as about 100 microns.

In some embodiments, the LC VCO further comprises one or both of a third conductive trace 305 and a fourth conductive trace 310 disposed in one or more metal layers other than a top metal layer of the metal layer stack. The conductive traces 305, 310 form other connections with the LC tank 205 and the pair of cross-coupled transistors 280, e.g., to the positive voltage supply and/or the negative voltage supply. In one embodiment, the conductive trace 305 is coupled with the first voltage supply node 225 and the conductive trace 310 is coupled with the third voltage supply node 260. In another embodiment, the conductive trace 305 is coupled with the third voltage supply node 260 and the conductive trace 310 is coupled with the first voltage supply node 225.

In the diagram 300, the conductive traces 305, 310 extend around the LC tank 205. In some embodiments, the conductive traces 305, 310 substantially circumscribe the LC tank 205. In some embodiments, the conductive traces 305, 310 substantially define a perimeter of the LC VCO. Although the conductive traces 305, 310 are depicted as substantially circumscribing a single LC tank 205, alternate implementations may have the conductive traces 305, 310 substantially circumscribing multiple LC tanks 205 (e.g., in a multi-lane transceiver IC having multiple PLLs). In some embodiments, the LC tank 205 is substantially circumscribed by the pair of cross-coupled transistors 280, the two conductive traces 265-1, 265-2, and the conductive trace 325 connected with the voltage supply node 225. In some embodiments, the LC tank 205 is further substantially circumscribed by the conductive trace 305 coupled with the voltage supply node 225, and by the fourth conductive trace 310 coupled with the ground node (e.g., the third voltage supply node 260).

In some embodiments, the other connections formed by the conductive traces 305, 310 comprise conductive traces 275-1, 275-2 of bulk (B) terminals of the nFETs 230-1, 230-2 to the third voltage supply node 260 (and to the negative voltage supply 262). Other types of connections are also contemplated, such as n-well connections of the nFETs 230-1, 230-2, and other biasing connections for components of the LC tank 205 and/or the pair of cross-coupled transistors 280.

In some embodiments, the high-frequency return path formed by the first decoupling capacitor 245-1 and the first conductive trace 265-1, and/or the high-frequency return path formed by the second decoupling capacitor 245-2 and the second conductive trace 265-2, is disposed between the LC tank, and the third conductive trace 305 and the fourth conductive trace 310.

Thus, diagram 300 illustrates a LC VCO having a high-quality common-mode current return path through the conductive traces 265-1, 265-2 extending between the tail node 235 of the LC VCO (e.g., a common source node of the nFETs 230-1, 230-2) and the third voltage supply node 260 (e.g., a ground node). Beneficially, the common-mode current return path has a very low substrate loss, providing a high-Q, high-SRF common-mode inductance, which increases the impedance at even-harmonic frequencies of the LC VCO. The LC VCO also includes high-Q metal decoupling capacitors 245-1, 245-2 that provide a low-impedance path at the even-harmonic frequencies. In this way, the conductive traces 265-1, 265-2 and the decoupling capacitors 245-1, 245-2 collectively define the return path for high-frequency currents between the voltage supplies. In some cases, the LC VCO also includes distinct connections for bulk terminals, n-wells, etc. for the nFETs 230-1, 230-2 to the voltage supplies using a separate set of conductive traces to mitigate additional parasitics at the tail node 235.

Figure 4:
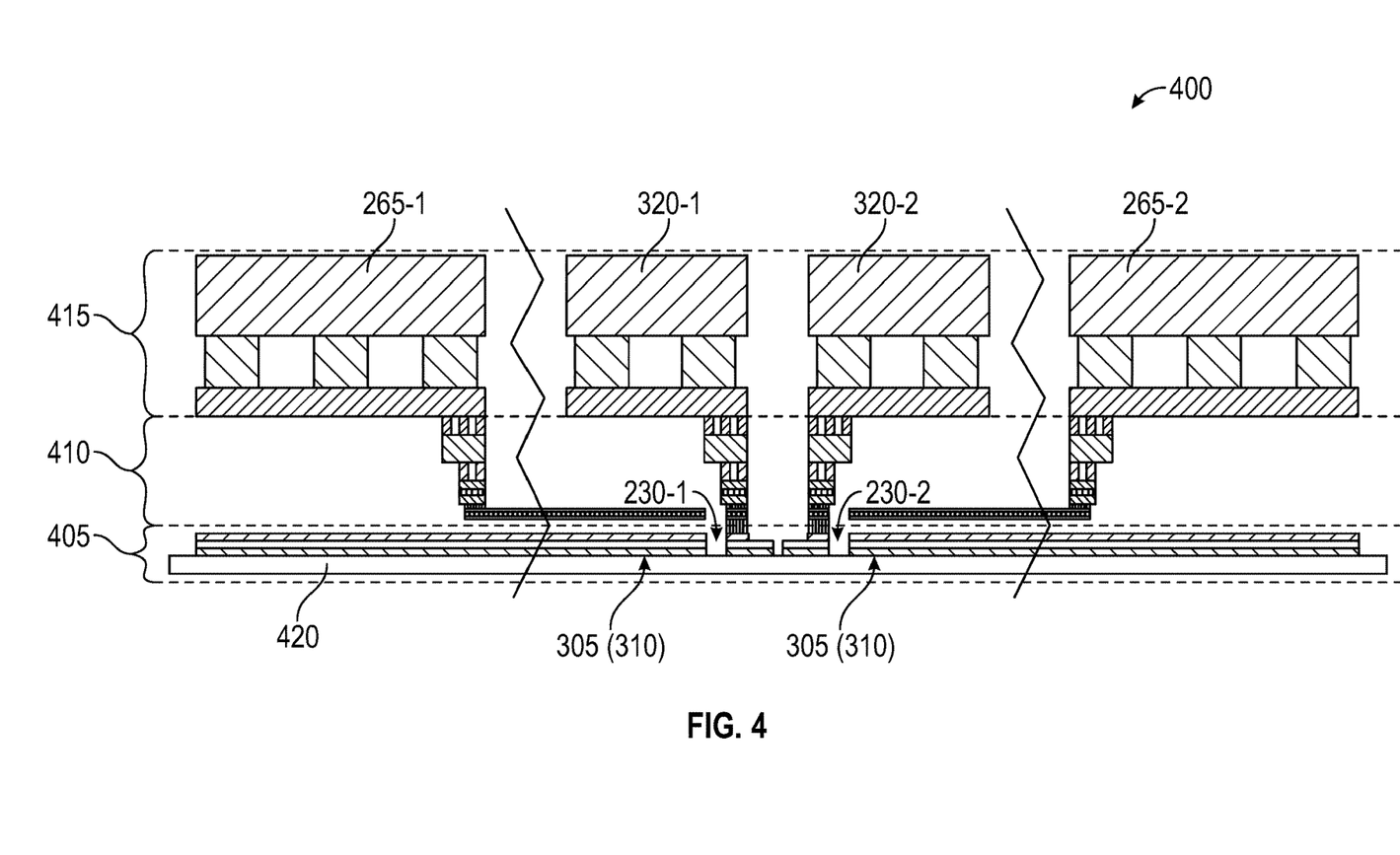
FIG. 4 is a diagram illustrating an end-view layout of an LC VCO having a high-frequency return path, according to one or more embodiments.

FIG. 4 is a diagram 400 illustrating an end-view (or a cross-section view) layout of an LC VCO having a high-frequency return path, according to one or more embodiments. The features of the diagram 400 may be used in conjunction with other embodiments. For example, the diagram 400 may represent an end view corresponding to the top-view layout of the LC VCO depicted in FIG. 3.

The metal layer stack of the LC VCO is disposed on a substrate 420 and includes a plurality of metal layers that are arranged into several groups: one or more bottom metal layers 405, one or more intermediate metal layers 410, and one or more top metal layers 415. Generally, the composition and/or dimensioning of the various metal layers are selected such that the one or more intermediate metal layers 410 have a higher Q than the one or more bottom metal layers 405, and the one or more top metal layers 415 have a higher Q than the one or more intermediate metal layers 410.

In one example implementation of the LC VCO, the one or more bottom metal layers 405 include the M0-M2 metal layers, the one or more intermediate metal layers 410 include the M3 and M4 metal layers, and the one or more top metal layers 415 include M5-M17 metal layers and optionally the bond pad ("AP") metal layer. Other compositions of the one or more bottom metal layers 405, the one or more intermediate metal layers 410, and the one or more top metal layers 415 are also contemplated.

In one embodiment, the conductive trace 305 (additionally or alternately, the conductive trace 310) connecting bulk (B) terminals of the nFETs 230-1, 230-2 to the third voltage supply node 260 (e.g., the ground node) is disposed in the one or more bottom metal layers 405. The conductive traces 265-1, 265-2 of the high-frequency return path, and the conductive traces 320-1, 320-2 of the capacitor 215, are disposed in the one or more top metal layers 415 having the relatively highest Q.

Figure 5:
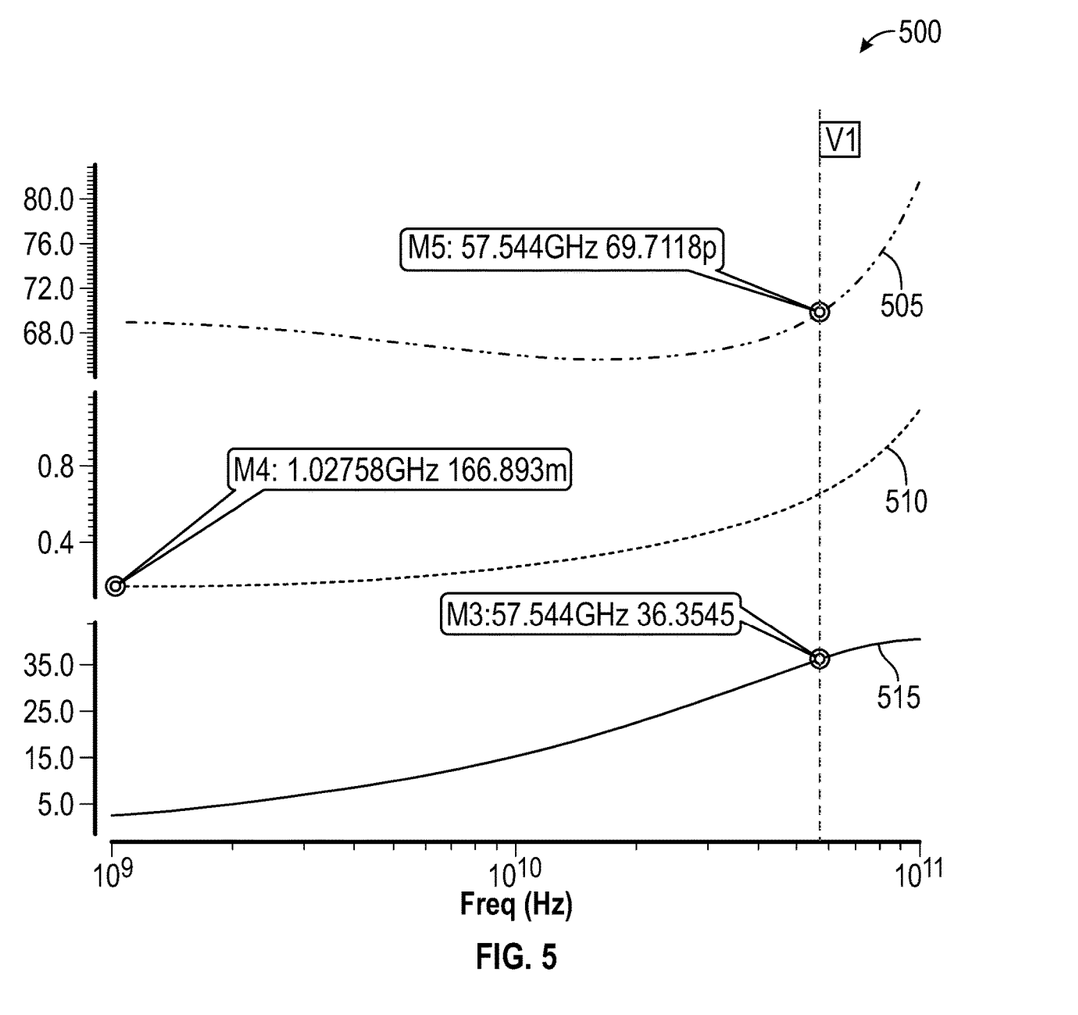
FIG. 5 is a graph illustrating characteristics of an exemplary conductive trace of an LC VCO having a high-frequency return path, according to one or more embodiments.

FIG. 5 is a graph 500 illustrating characteristics of an exemplary conductive trace of an LC VCO having a high-frequency return path, according to one or more embodiments. The features of the graph 500 may be used in conjunction with other embodiments. For example, the graph 500 may represent simulated operation of the LC VCO of FIG. 3.

In some embodiments, the LC VCO operates with a fundamental frequency ($f_0$) between about 25 GHz and 30 GHz, such as 28 GHz. Operation of the LC VCO in this frequency range can support transceiver applications of 200 GB per lane or greater. In the graph 500, plot 505 represents an inductance (L) and plot 510 represents a resistance (R) presented at the tail node 235 by the conductive traces 265-1, 265-2 of the high-frequency return path, across a range of frequencies. Assuming a fundamental frequency of 28 GHz, the conductive traces 265-1, 265-2 present an inductance of about 70 picohenries (pH) at twice the fundamental frequency (56 GHZ), and present a DC resistance of about 0.17 ohms ($\Omega$). By maintaining a low DC-resistance, DC voltage drops and the phase noise of the LC VCO are minimized. Plot 515 represents a Q value of the inductances presented at the tail node 235 by the conductive traces 265-1, 265-2. At twice the fundamental frequency, the inductances have a Q value of about 36.

Figure 6:
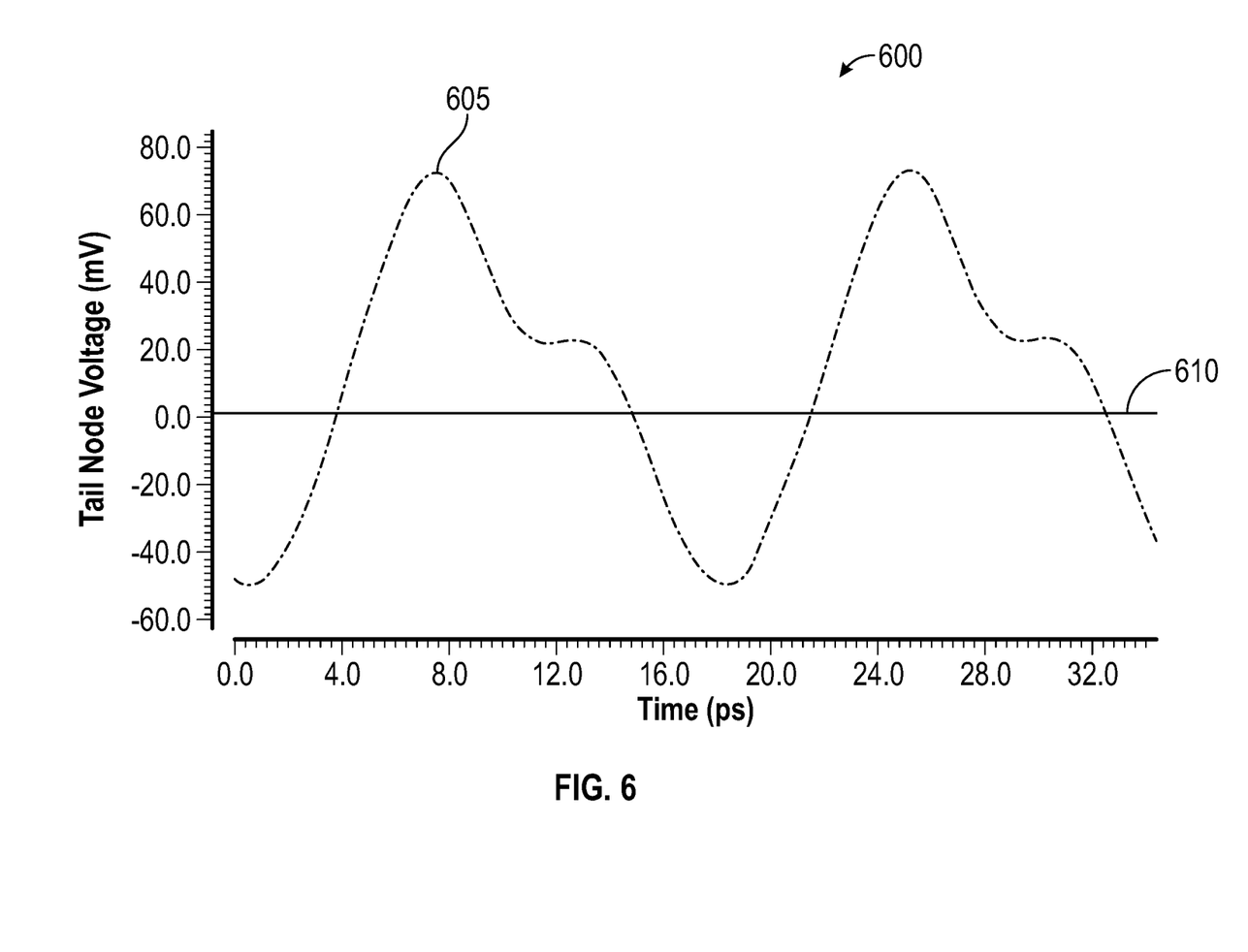
FIG. 6 is a graph illustrating waveforms at a tail node of an LC VCO having a high-frequency return path, according to one or more embodiments.

FIG. 6 is a graph 600 illustrating waveforms at a tail node of an LC VCO having a high-frequency return path, according to one or more embodiments. The features of the graph 600 may be used in conjunction with other embodiments. For example, the graph 600 may represent simulated operation of the LC VCO of FIG. 3.

Plot 605 represents a voltage waveform of the LC VCO at the tail node 235, where the LC VCO has the conductive traces 265-1, 265-2 connected to the tail node 235, and plot 610 represents the voltage at the tail node 235 without the conductive traces 265-1, 265-2. For example, in the LC VCO of the plot 610, the tail node 235 may be connected to the voltage supply nodes 255-1, 255-2 (e.g., to the lower plates of the decoupling capacitors 245-1, 245-2) using a ground mesh disposed in the one or more bottom metal layers. In the plot 610, the voltage remains substantially constant near zero. In the plot 605, the voltage at the tail node 235 varies between about 70 mV and −50 mV, with the even harmonics of the fundamental frequency, such as $2*f_0$, $4*f_0$, and so forth. Stated another, the voltage at the tail node 235 swings according to the even harmonics.

Implementations of the LC VCO with the conductive traces 265-1, 265-2 present a greater common-mode impedance (e.g., up to 5× or greater) than the implementations without the conductive traces 265-1, 265-2. In this way, less loading of the LC tank 205 occurs, resulting in a larger output amplitude of the LC VCO. For example, an output voltage of the LC VCO (e.g., measured at the drain terminal of the nFET 230-2) has a peak-to-peak voltage of about 0.83 V with the conductive traces 265-1, 265-2, and about 0.77 V without the conductive traces 265-1, 265-2. This larger output amplitude corresponds to a lower phase noise of the LC VCO (e.g., about a 2 dB improvement) without any additional area or power overhead.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The block diagrams in the Figures illustrate the architecture, functionality, and operation of possible implementations of systems, methods, and computer program products according to various embodiments. In this regard, each block in the block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A voltage-controlled oscillator (VCO) comprising:
an inductor-capacitor (LC) tank coupled with a first voltage supply node;
a pair of cross-coupled transistors that are coupled with the LC tank and coupled with each other at a tail node; and
a high-frequency current return path to the first voltage supply node, the high-frequency current return path comprising:
a first decoupling capacitor coupled with the first voltage supply node and a second voltage supply node; and
a first inductor coupled with the tail node and the second voltage supply node, wherein the first inductor is formed as a first conductive trace and has a quality factor (Q) value of 25 or greater.

2. The VCO of claim 1, the high-frequency current return path further comprising:
a second decoupling capacitor coupled with the first voltage supply node and the second voltage supply node; and
a second inductor coupled between the tail node and the second voltage supply node, wherein the second inductor is formed as a second conductive trace and has a Q value of 25 or greater.

3. The VCO of claim 2, wherein the first conductive trace and the second conductive trace are formed in a topmost metal layer of a metal layer stack of the VCO.

4. The VCO of claim 2, wherein the first decoupling capacitor and the first inductor are disposed on a first side of the LC tank, and wherein the second decoupling capacitor and the second inductor are disposed on an opposing second side of the LC tank.

5. The VCO of claim 1, wherein the first decoupling capacitor comprises a metal-oxide-metal capacitor.

6. The VCO of claim 1, further comprising one or both of:
a third conductive trace coupled with the first voltage supply node; and
a fourth conductive trace coupled with a third voltage supply node,
wherein the third conductive trace and the fourth conductive trace are disposed in one or more metal layers below those of the first conductive trace and a second conductive trace that forms a second inductor coupled between the tail node and the second voltage supply node, and form other connections with the LC tank and the pair of cross-coupled transistors.

7. The VCO of claim 6, wherein the other connections comprise connections of bulk terminals of the pair of cross-coupled transistors to the third voltage supply node.

8. The VCO of claim 6, wherein the high-frequency current return path is disposed between the LC tank, and the third conductive trace and the fourth conductive trace.

9. An electronic circuit comprising:
a differential inductor-capacitor (LC) voltage-controlled oscillator (VCO); and
a high-frequency current return path comprising:
at least one decoupling capacitor extending between a voltage supply node and a ground node, the decoupling capacitor comprising a metal-oxide-metal capacitor; and
at least one inductor formed as a conductive trace extending between a tail node of the differential LC VCO and the ground node, the conductive trace disposed in a first metal layer of five topmost metal layers of a metal layer stack of the electronic circuit.

10. The electronic circuit of claim 9, wherein the differential LC VCO comprises a pair of cross-coupled transistors, wherein source terminals of the pair of cross-coupled transistors are connected with each other at the tail node.

11. The electronic circuit of claim 10, wherein bulk terminals of the pair of cross-coupled transistors are connected to the ground node using at least one other conductive trace disposed in one or more second metal layers below the first metal layer.

12. The electronic circuit of claim 9, wherein the at least one decoupling capacitor comprises two decoupling capacitors, and wherein the conductive trace comprises two conductive traces each connected to the ground node of a respective one of the two decoupling capacitors.

13. The electronic circuit of claim 12, wherein the differential LC VCO comprises:
a LC tank coupled, through another conductive trace disposed in a second metal layer in the five topmost metal layers, with the voltage supply node; and
a pair of cross-coupled transistors that are coupled with the LC tank and coupled with each other at the tail node.

14. The electronic circuit of claim 13, wherein the LC tank is substantially circumscribed by the pair of cross-coupled transistors, the two conductive traces, and another conductive trace connected with the voltage supply node.

15. The electronic circuit of claim 14, wherein the LC tank is further substantially circumscribed by a third conductive trace coupled with the voltage supply node, and by a fourth conductive trace coupled with the ground node.

16. An electronic circuit comprising:
a differential inductor-capacitor (LC) voltage-controlled oscillator (VCO) comprising a pair of cross-coupled transistors connected with each other at a tail node;
at least one decoupling capacitor extending between a voltage supply node and a ground node;

at least a first conductive trace disposed in a first metal layer and extending between the tail node and the ground node; and at least a second conductive trace, disposed in a second metal layer below the first metal layer, and extending between bulk terminals of the pair of cross-coupled transistors and the ground node or a power node.

17. The electronic circuit of claim 16, wherein the second conductive trace comprises a ground mesh or a power mesh.

18. The electronic circuit of claim 16, wherein the at least one decoupling capacitor comprises two decoupling capacitors, and wherein the at least the first conductive trace comprises two conductive traces each connected to the ground node of a respective one of the two decoupling capacitors.

19. The electronic circuit of claim 16, wherein the decoupling capacitor comprises a metal-oxide-metal capacitor.

20. The electronic circuit of claim 16, wherein the first metal layer is a topmost metal layer of a metal layer stack of the electronic circuit.

\* \* \* \* \*